United States Patent
Shepherd et al.

(10) Patent No.: US 9,089,063 B2
(45) Date of Patent: *Jul. 21, 2015

(54) METHOD OF REDUCING SOLDER WICKING ON A SUBSTRATE

(71) Applicants: Flextronics AP, LLC, San Jose, CA (US); Cisco Technology, Inc., San Jose, CA (US)

(72) Inventors: Glen C. Shepherd, Austin, TX (US); Anthony Aaron Lynn Burton, Sunnyvale, CA (US); Michael Ryan Ng, Burlingame, CA (US); Mimi Munson Tantillo, San Jose, CA (US); Dieu-Huong Nguyen Tran, Santa Clara, CA (US)

(73) Assignees: Flextronics AP, LLC, San Jose, CA (US); Cisco Technology, Inc., San Jose, CA (US)

(*) Notice: Subject to any disclaimer, the term of this patent is extended or adjusted under 35 U.S.C. 154(b) by 0 days.

This patent is subject to a terminal disclaimer.

(21) Appl. No.: 13/759,960

(22) Filed: Feb. 5, 2013

(65) Prior Publication Data

US 2013/0221075 A1   Aug. 29, 2013

Related U.S. Application Data

(60) Continuation of application No. 12/653,358, filed on Dec. 11, 2009, now Pat. No. 8,378,222, which is a division of application No. 10/774,115, filed on Feb. 6, 2004, now Pat. No. 7,645,940.

(51) Int. Cl.
*H05K 1/00* (2006.01)
*H05K 1/11* (2006.01)
*H05K 3/34* (2006.01)

(52) U.S. Cl.
CPC ............... *H05K 1/115* (2013.01); *H05K 1/114* (2013.01); *H05K 3/3442* (2013.01); *H05K 3/3452* (2013.01); *H05K 2201/099* (2013.01); *H05K 2201/09381* (2013.01); *H05K 2201/10636* (2013.01); *Y10T 29/49144* (2015.01); *Y10T 29/49165* (2015.01)

(58) Field of Classification Search
USPC ................... 174/259–266; 361/767, 772–774
See application file for complete search history.

(56) References Cited

U.S. PATENT DOCUMENTS

| 4,413,309 | A |   | 11/1983 | Takahashi et al. |   |
|---|---|---|---|---|---|
| 4,874,907 | A | * | 10/1989 | Ishikawa | ...................... 174/261 |
| 5,303,122 | A |   | 4/1994 | Adams, Jr. et al. |   |
| 5,313,021 | A |   | 5/1994 | Sajja et al. |   |
| 5,362,927 | A | * | 11/1994 | Ezaki | ............................ 174/261 |
| 5,384,433 | A |   | 1/1995 | Osann et al. |   |

(Continued)

*Primary Examiner* — Tuan T Dinh
(74) *Attorney, Agent, or Firm* — Robert Moll

(57) ABSTRACT

This invention relates to a substrate with via and pad structure(s) to reduce solder wicking. Each via and pad structure connects a component to conductive layers associated with the substrate. The substrate includes one or more plated vias, solder mask(s) surrounding the plated vias, and a conductive pad with a conductive trace connected to each plated via. The conductive pad extends beyond the terminal sides to increase solder formation and the solder mask reduces solder formation at the terminal end of the component. The via and pad structure is suitable for a variety of components and high component density. The invention also provides a computer implemented method for calculating the maximum distance of a conductive pad extending beyond the terminal side of a component.

20 Claims, 5 Drawing Sheets

(56) References Cited

U.S. PATENT DOCUMENTS

| | | |
|---|---|---|
| 5,459,287 A | 10/1995 | Swamy |
| 5,459,642 A | 10/1995 | Stoddard |
| 5,637,835 A | 6/1997 | Matern |
| 5,683,788 A | 11/1997 | Dugan et al. |
| 5,731,960 A | 3/1998 | Fung |
| 5,805,428 A | 9/1998 | Singer |
| 5,811,736 A | 9/1998 | Lauffer et al. |
| 6,104,082 A | 8/2000 | Berlin et al. |
| 6,300,578 B1 | 10/2001 | Hoffmeyer et al. |
| 6,549,179 B2 | 4/2003 | Youngquist et al. |
| 6,630,631 B1 | 10/2003 | Dishongh et al. |
| 7,186,926 B2 * | 3/2007 | Maeno ................ 174/260 |
| 2003/0063447 A1 | 4/2003 | Cwik et al. |
| 2003/0064546 A1 | 4/2003 | McCormick et al. |
| 2003/0148557 A1 | 8/2003 | Lim et al. |

\* cited by examiner

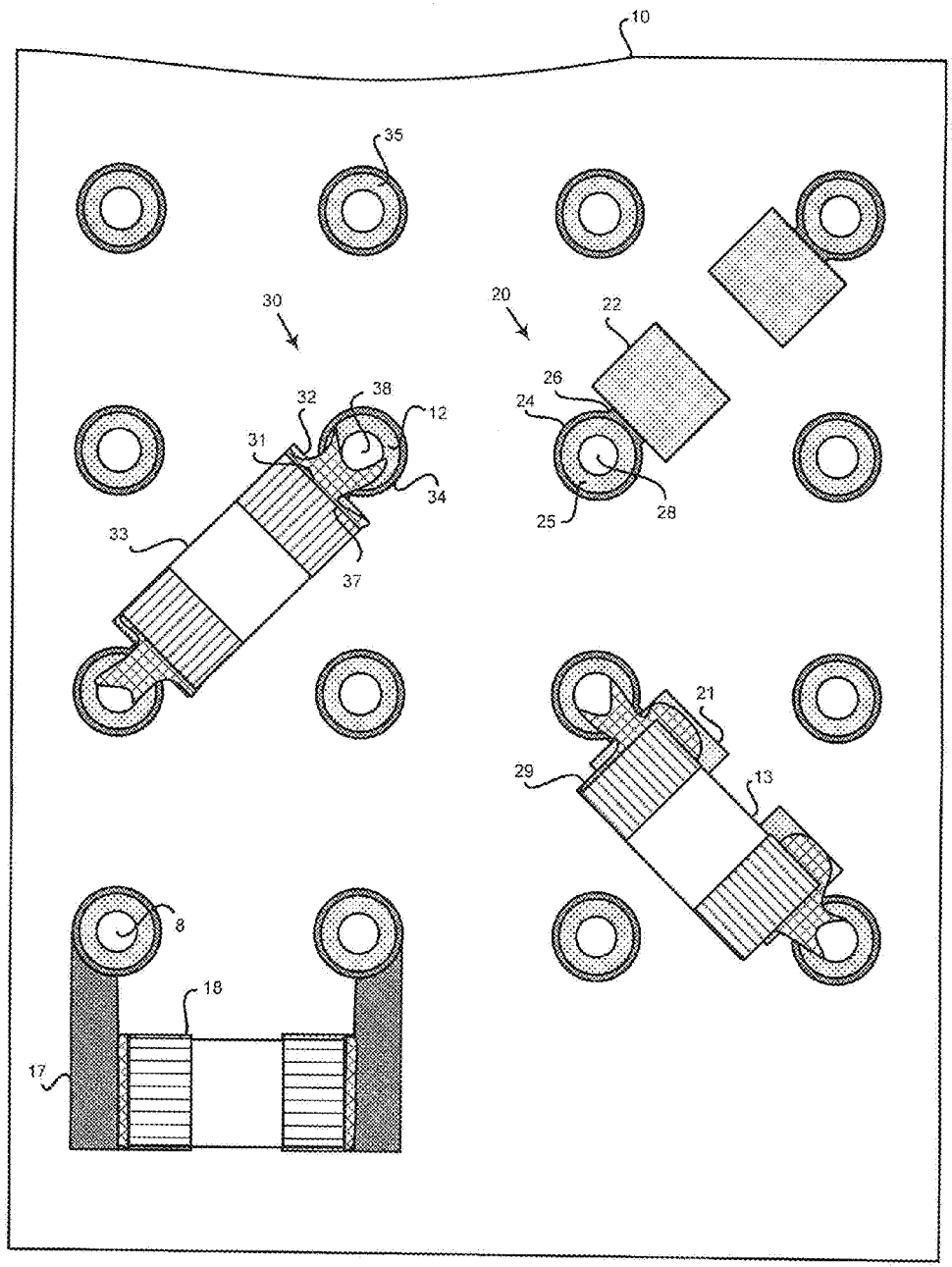
FIGURE 1 - Prior Art

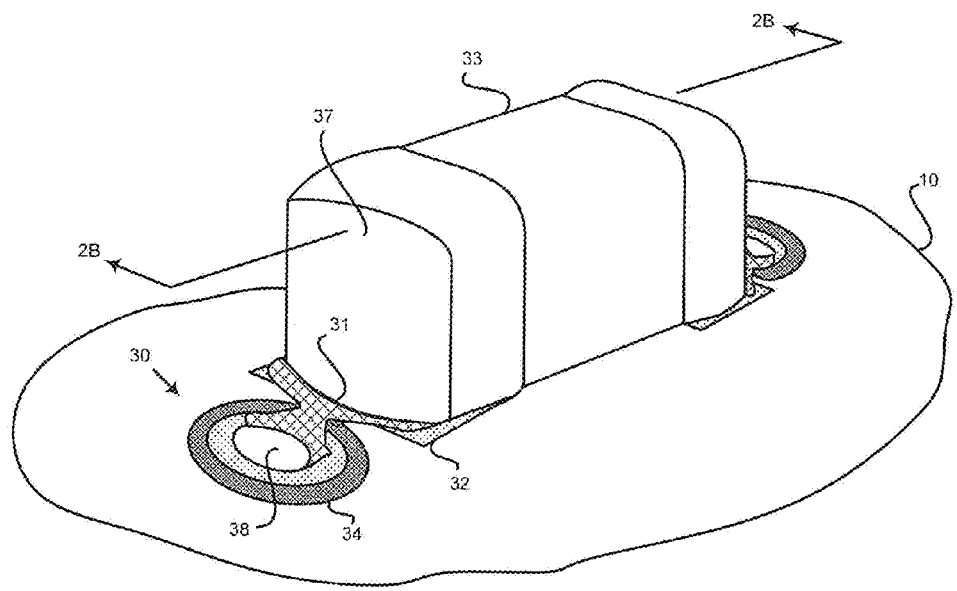
FIGURE 2A - Prior Art
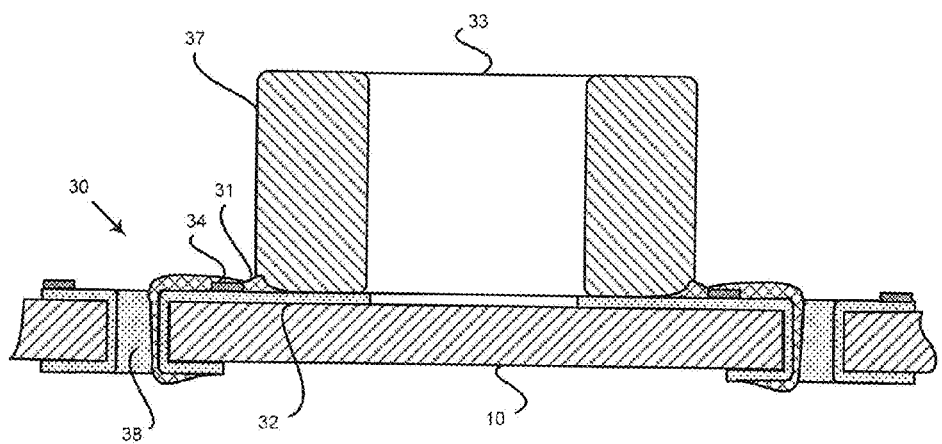
FIGURE 2B - Prior Art

METHOD OF REDUCING SOLDER WICKING ON A SUBSTRATE

This application is a continuation of U.S. application Ser. No. 12/653,358, Method of Reducing Solder Wicking on a Substrate, filed on Dec. 11, 2009, which is a divisional of U.S. application Ser. No. 10/774,115, Substrate with Via and Pad Structures, filed on Feb. 6, 2004, now U.S. Pat. No. 7,645,940, all which are incorporated by reference herein.

BACKGROUND

The present invention relates to a substrate with one or more via and pad structures for use in circuit assemblies with high reliability and high yield in manufacturing.

FIG. 1 illustrates a printed wiring board (PWB) with a substrate 10 having several plated vias such as plated via 35. Each plated via connects to associated conductive layers of the substrate 10. The conductive layers are located on the top, bottom, and/or in the substrate 10. Another structure is the via and pad structure such as via and pad structure 20 shown without a component. Via and pad structure 20 includes a solder mask 24, and a conductive trace 26 connecting a conductive pad 22 and a plated via 25 with a via hole 28.

FIG. 1 also illustrates that when conductive pad 32 is close to the via hole 38 the solder mask 34 will not prevent the solder from being siphoned into the via hole 38. The small amount of solder remaining will form an unreliable solder joint 31 at the terminal end 37 of the component 33. This problem is referred to as solder wicking. Decreasing the inner diameter of the solder mask 34 may reduce the solder wicking, but will require that the solder mask 34 be precisely aligned on the plated via 12 to avoid covering the via hole 38 and trapping contaminants causing corrosion. Gold plating on the plated via 12 may decrease corrosion but will increase solder wicking by increasing the wettability of the plated via 12. Solder wicking can also misalign a component with respect to a conductive pad such as terminal end 29 of component 13 which is misaligned with respect to the conductive pad 21. Another approach to reduce solder wicking is to move the conductive pad 18 further from the via hole 8, but this requires a long conductive trace, such as that covered by solder mask 17, which increases trace inductance and degrades performance at high frequencies.

FIG. 2A is a perspective view and FIG. 2B a sectional view of a surface mount component 33 on a substrate 10. FIGS. 2A-2B illustrate the solder wicking problem that arises using conventional via and pad structure 30. The unreliable solder joint 31 is formed on the terminal end 37 of the component 33 because the solder mask 34 is not effective due to the capillary action of the via hole 38 in close proximity to the conductive pad 32.

SUMMARY OF THE INVENTION

The present invention relates to a substrate with via and pad structures for use in circuit assemblies. In an embodiment, the substrate has one or more via and pad structures for connecting a component to conductive layers associated with the substrate. The via and pad structure includes a plated via connected to associated conductive layers, a solder mask surrounding the plated via, and a conductive pad with a conductive trace connected to the plated via, wherein the conductive pad extends beyond the terminal sides of the component to increase solder formation at the terminal sides and the solder mask reduces solder formation at the terminal end of the component. The via and pad structures are applicable to the circuit layouts for a variety of components and high component density can be achieved with reliable solder joints to the component terminal sides rather than the terminal end. The invention also provides a method for calculating the distance the conductive pad extends beyond the terminal side of a component.

BRIEF DESCRIPTION OF THE DRAWINGS

FIG. 1 illustrates a PWB using conventional via and pad structures.

FIG. 2A is a perspective view of a component connected by a pair of conventional via and pad structures.

FIG. 2B is a sectional view illustrating an unreliable solder joint formed on a terminal end of component when using a conventional via and pad structure.

DETAILED DESCRIPTION OF THE PREFERRED EMBODIMENTS

Figure 3:
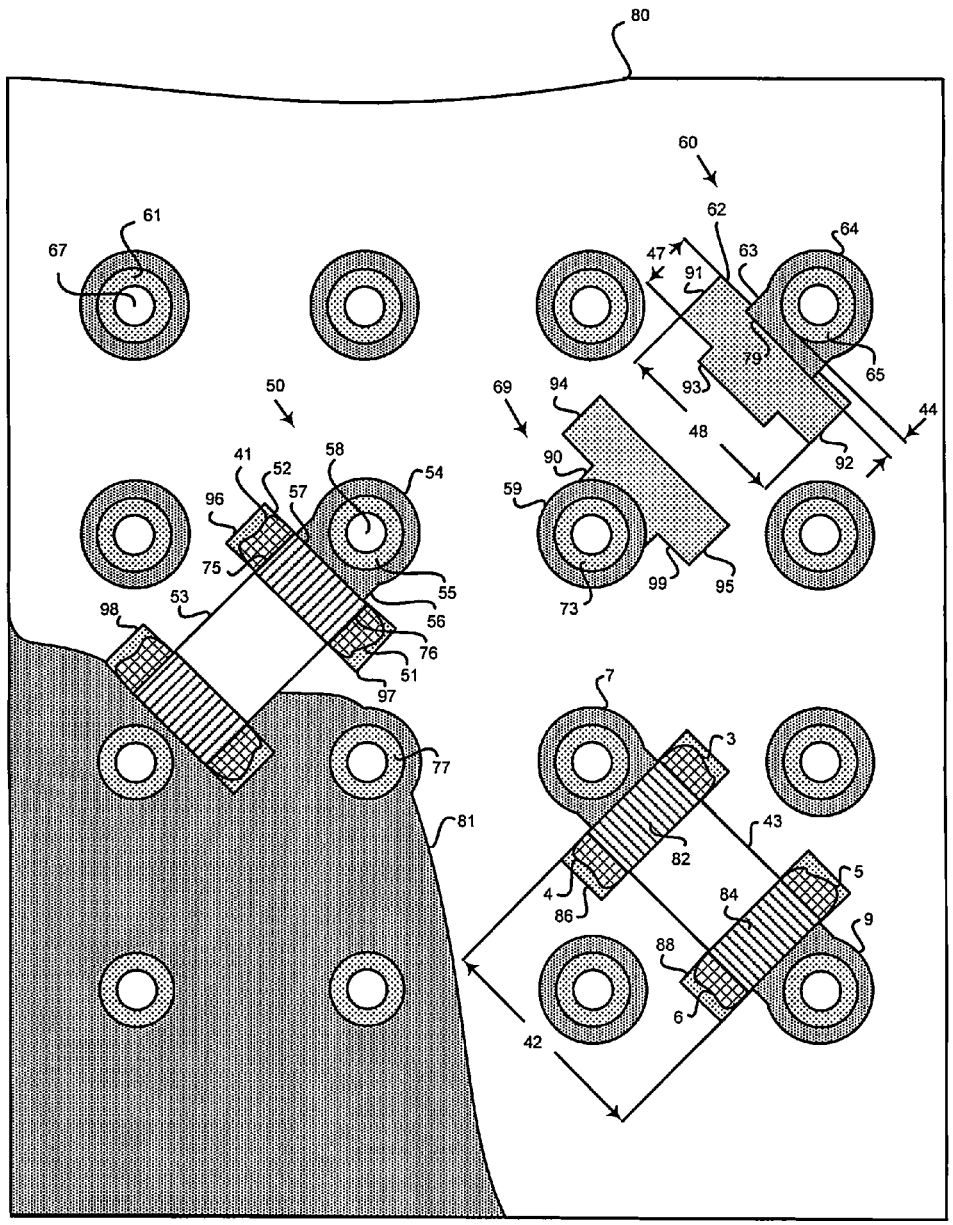
FIG. 3 illustrates a PWB or printed circuit board using via and pad structures for mounting components.

The following description includes the best mode of carrying out the invention. The detailed description is made for the purpose of illustrating the general principles of the invention and should not be taken in a limiting sense. The scope of the invention is determined by reference to the claims.

We assign each part, even if structurally identical to another part, a unique reference number wherever that part is shown in the drawing figures. A dashed circle indicates part of a figure that is enlarged in another figure. Any figure showing the enlarged part is indicated by a reference number tied to the dashed circle.

FIG. 3 illustrates a substrate such as a PWB or a printed circuit board with via and pad structures for connecting surface mount components. A surface mount component such as component 43 has plated terminals 82 and 84 to form solder joints 3, 4, 5, and 6 with corresponding conductive pads 86 and 88. The substrate 80 may include conductive top, bottom, and/or embedded layers. The plated vias such as plated via 61, connected to associated conductive layers, can be formed by drilling a hole in substrate 80 then plating the hole to form a via hole 67.

Although components can be arranged along a column or row of the array of plated vias, the tight spacing in an array in a typical PWB limits the component to being placed diagonally as shown. A component 43 representing, for example, a 0402 size (i.e., 0.04" length×0.02" width×0.02" height) chip capacitor, shown in the bottom right of FIG. 3, is oriented diagonally in a space 42, that is, between the keyhole shaped solder masks 7 and 9. This orientation keeps the conductive trace to a minimal length which minimizes trace inductance causing performance degradation such as group delay, self-resonance with capacitive components or frequency roll off.

In via and pad structure 60, the conductive pad 62 has a conductive trace 63 (covered by the keyhole shaped solder mask 64) and connected to a plated via 65. The close proximity of the plated via 65 to the conductive pad 62 means the conductive trace 63 is short in length and has low trace inductance. In the illustrated embodiment, the conductive pad 62 includes a T-shirt shaped structure of a first arm 91, a second arm 92, and a body 93. Preferably, the body 93 extends beyond the length 47 of the arms 91 and 92. The conductive pad 62 has arms 91 and 92 with a width 48 that extends beyond the terminal sides of the component (not shown). Via and pad structure 69 depicts an alternative embodiment, where conductive trace 90 connects the conductive pad 99 to the plated via 73 and a ring shaped solder mask 59 acts as a solder barrier. Conductive pad 99 includes arms 94 and 95 but no body such as the body 93 in conductive pad 62.

The extended conductive pad increases formation of a reliable solder joint on each terminal side of the component. This is shown in via and pad structure 50, which has the solder joints 41, 51 on the terminal sides 75 and 76.

Each solder mask such as the keyhole shaped solder mask 54 is made of non-conductive and non-wettable material such as an epoxy, a photo imageable solder mask, or another suitable material. Solder masks such as solder masks 54 and 64 are keyhole shaped and have a sufficient width 44 to form a solder barrier despite the short length of the conductive traces 56 and 63. For example, a 0402 component would overlay the keyhole shaped solder mask 54. The keyhole shaped solder mask 54 is the same shape as the keyhole shaped solder mask 64 and both have a typical width 44 of 3.5 mil and preferably greater to reduce formation of a solder joint such as at the terminal end 57 of component 53, which prevents solder wicking. Solder joints 41 and 51 form on the terminal sides 75 and 76 and the conductive pad 52. In an alternative embodiment, the solder mask 81 covers the substrate 80 partially or entirely except for the conductive pads such as conductive pad 98 and the plated via holes such as plated via hole 77.

In an embodiment, the via and pad structure 50 has a conductive pad 52 that extends beyond the terminal sides 75 and 76 of the component 53 to increase solder formation on arms 96 and 97. In addition, the arms 96 and 97 are preferably symmetric to the plated via 55 on the substrate 80 so the solder joints 41 and 51 will generate substantially equal surface tension to the terminal sides 75 and 76 of the component 53. This keeps the component 53 aligned with the conductive pads 52 and 98.

Figure 4A:
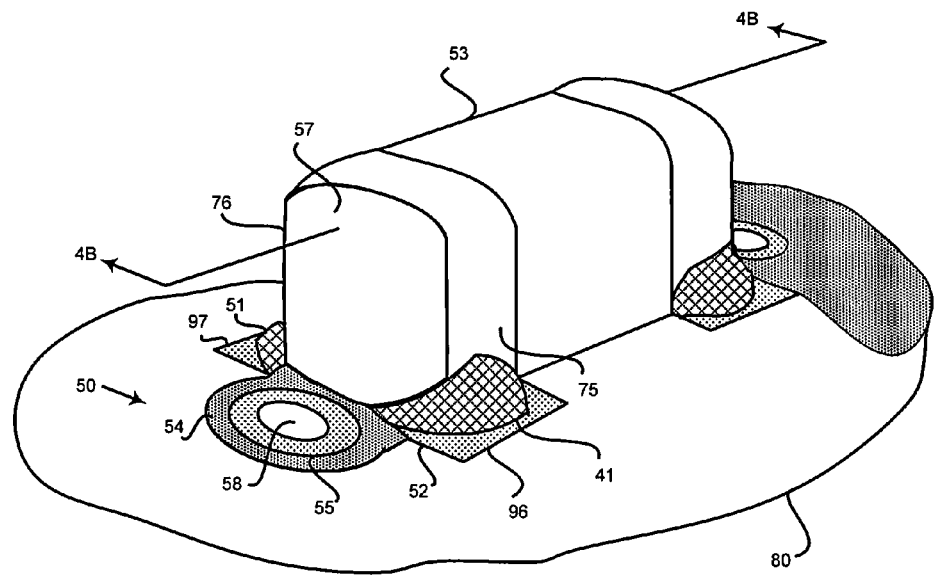
FIG. 4A is a perspective view of a component mounted on a pair of via and pad structures.

FIG. 4A is a perspective view illustrating a component 53 using a via and pad structure 50. The keyhole shaped solder mask 54 surrounds the plated via 55 and reduces the formation of a solder joint at the terminal end 57. Solder joints 41 and 51 form on terminal sides 75 and 76 as well as arms 96 and 97. Because the arms 96 and 97 are substantially equal areas the solder joints 41 and 51 generate substantially equal surface tension during solder reflow that keeps the surface mount component 53 aligned with the conductive pad 52.

Figure 4B:
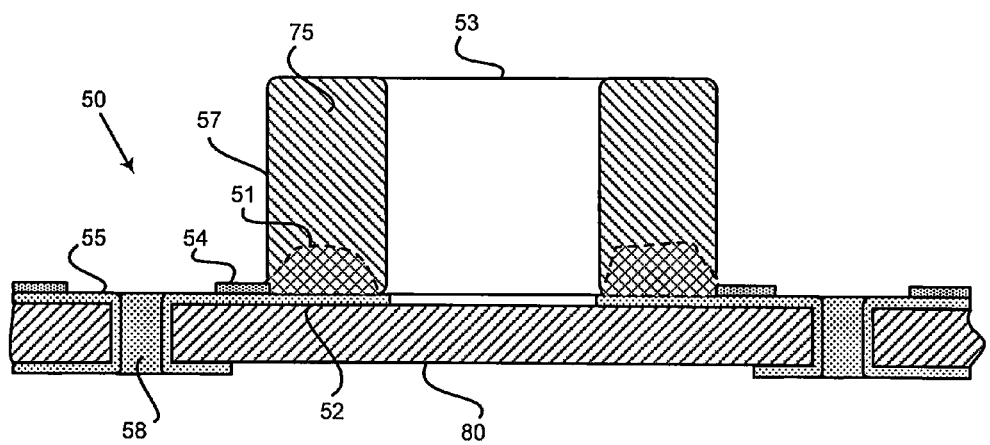
FIG. 4B is a sectional view illustrating the solder joint formed on the terminal sides of the component using the via and pad structures.

FIG. 4B is a sectional view of the component 53 shown in FIG. 4A illustrating the solder joint 51 formed on the terminal side 75 using a via and pad structure 50 on substrate 80. The keyhole shaped solder mask 54 reduces or prevents the formation of a solder joint at terminal end 57 on the conductive pad 52 thus reducing solder wicking where the solder crosses over the keyhole shaped solder mask 54 into the via hole 58.

In another embodiment of the via and pad structure, the wettability of the plated via can be reduced by applying a chemically compatible plating finish to the surface of the plated via such as a known organic oxidant surface finish or immersion silver. This reduces solder wicking during the solder reflow process.

Figure 5:
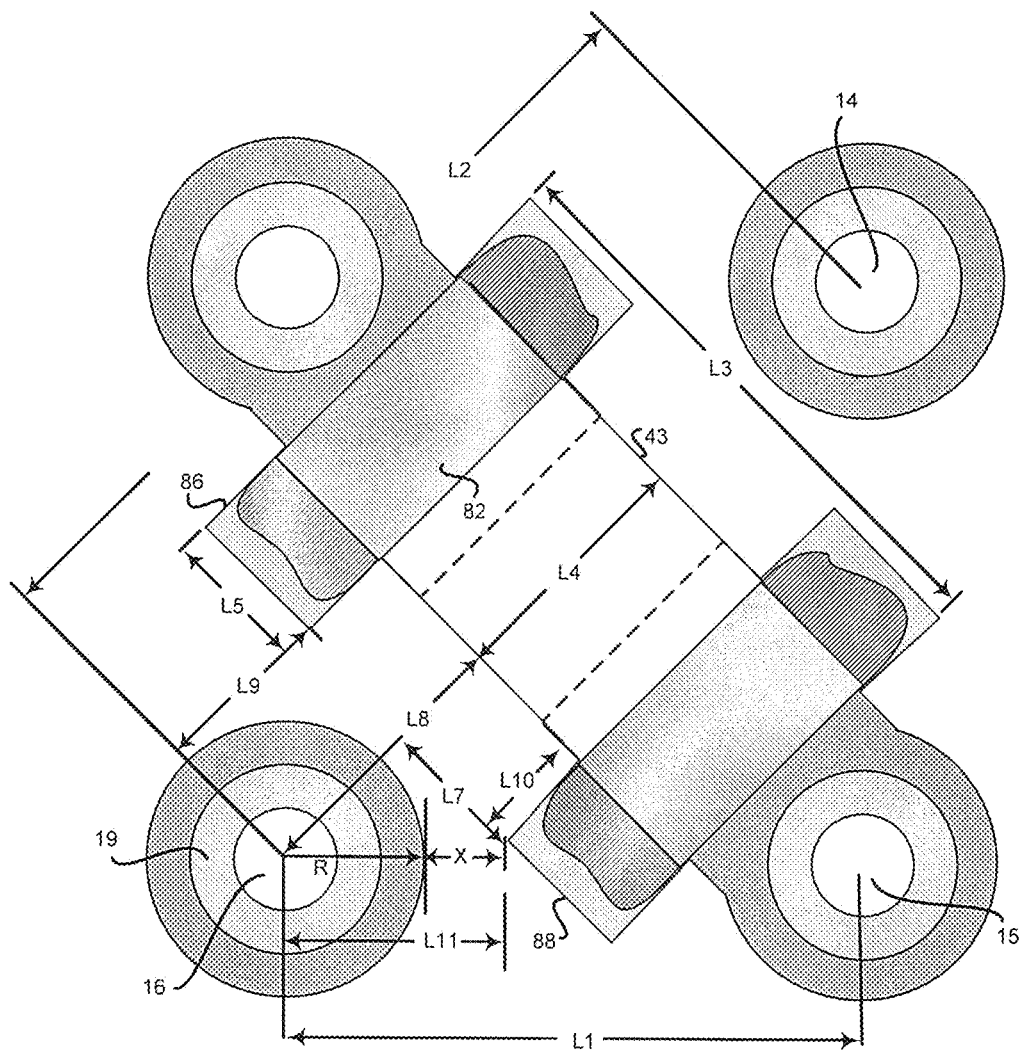
FIG. 5 illustrates the relationship, spacing and geometry of the conductive pads.

FIG. 5 illustrates the spatial relationship of the via and pad structures to provide a method of sizing the conductive pads 86 and 88 that can be implemented in computer software. The method shows how to maximize the distance the conductive pad extends beyond the terminal side to reduce solder wicking without generating any electrical shorts between the conductive pad and the adjacent plated via. The method also optimizes component density. As shown in FIG. 5, L1 is the center-to-center distance between the via hole 15 and the via hole 16. Component 43 has a length L3 and a width L4. L2 is the center-to-center distance of the via hole 14 and the via hole 16. L2 is also the hypotenuse of a square with sides of length L1. L5 is the length of the conductive pad 86 extending beyond the terminal side. L5 can be greater than or equal to the plated terminal 82 of component 43. L7 is half the distance between the conductive pads 86 and 88 extending beyond the terminal side. L8 is the distance from the center of the via hole 16 to the side of component 43. Radius R is outer radius of the plated via 19. Distance X is the minimum distance between the plated via 19 to the conductive pad 88. L11 is the sum of radius R and X. The distance X is set as a design rule to prevent solder wicking. A right triangle is formed by the sides L7, L9 and L11. Once L11 and L7 are known, Pythagorean theorem can be used to solve for L9. Subtracting L9 from L8 gives us L10, which is the maximum distance of the conductive pad 88 extending beyond the terminal side of the component 43.

For example, we can calculate the maximum distance L10 for a 0402 component by using the following values: L1=39.39 mil (1 mm), L3=40 mil, L4=20 mil, L5=10 mil, R=9.5 mil, and X=5 mil.

L2=L1/sin 45°=55.7 mil
L8=(L2−L4)/2=17.9 mil
L7=L3/2−L5=10 mil
L11=R+X=14.5 mil
L9=square root $(L11^2-L7^2)$=10.5 mil
L10=L8−L9=7.4 mil L10 may be then rounded to 7 mil for the layout. This method can be implemented in computer software where the variables are represented by values to solve other layouts for other component sizes.

What is claimed:

1. A method of reducing solder wicking on a substrate when connecting a surface mount component to a plated via and conductive pad structure connected to conductive layers of the substrate, comprising:
    placing the surface mount component on the plated conductive pad, wherein the surface mount component includes a package having an upper surface with solderable terminal sides and a terminal end;
    surrounding the plated via with a solder mask;
    exposing a part of the conductive pad that extends beyond each of the solderable terminal sides of the surface mount component to increase solder formation between the conductive pad and the solderable terminal sides; and
    covering with a solder mask the part of the conductive pad that extends beyond the solderable terminal end to reduce solder formation at the terminal end of the surface mount component and to reduce solder formation at the plated via.

2. The method of claim 1, further comprising extending a first arm and a second arm of the conductive pad beyond the solderable terminal sides of the surface mount component.

3. The method of claim 1, further comprising forming the conductive pad to include a first arm, a second arm, and a body.

4. The method of claim 1, further comprising forming the conductive pad as a T-shirt shaped structure.

5. The method of claim 1, further comprising forming the solder mask in a keyhole shape.

6. The method of claim 1, further comprising covering the substrate partially or entirely with a solder mask except the conductive pad and the plated via.

7. The method of claim 1, further comprising soldering the conductive pad to the surface mount component, wherein the solder joints have a greater volume at the solderable terminal sides than at the terminal end of the surface mount component.

8. The method of claim 1, wherein the substrate is a printed circuit board.

9. The method of claim 1, wherein the substrate is part of a BGA package footprint.

10. The method of claim 1, wherein the solder mask is a ring surrounding the plated via.

11. The method of claim 2, further comprising forming the first arm and second arms symmetrically with respect to the plated via.

12. The method of claim 3, further comprising forming the first arm and the second arm symmetrically with respect to the plated via.

13. The method of claim 4, further comprising forming the T-shirt shaped structure symmetrically with respect to the plated via.

14. A method of reducing solder wicking on a substrate when connecting a surface mount component to conductive layers of the substrate, comprising:
   providing a surface mount component that includes a package having an upper surface with first solderable terminal sides and a first terminal end and second solderable terminal sides and a second terminal end;
   connecting a first plated via to a first conductive layer;
   surrounding the first plated via with a first solder mask;
   connecting a second plated via to a second conductive layer;
   surrounding the second plated via with a second solder mask;
   connecting a first conductive pad with a conductive trace to the first plated via, wherein the first conductive pad includes a portion that is exposed to solder and extends beyond the first solderable terminal sides of the surface mount component to increase solder formation along the first solderable terminal sides and to reduce solder formation at the first plated via;
   connecting a second conductive pad with a conductive trace connected to the second plated via, wherein the second conductive pad includes a portion that is exposed to solder and extends beyond the second solderable terminal sides of the surface mount component to increase solder formation along the second solderable terminal sides and to reduce solder formation at the second plated via;
   reducing solder formation using a first solder mask at the first terminal end of the surface mount component; and
   reducing solder formation using a second solder mask at the second terminal end of the surface mount component.

15. The method of 14, further comprising forming a first arm and a second arm in each of the first and second conductive pads.

16. The method of claim 14, further comprising forming a first arm, a second arm, and a body in each of the first and second conductive pads.

17. The method of claim 14, further comprising surrounding the first and the second plated vias with first and second ring-shaped solder masks, respectively.

18. The method of claim 14, further comprising surrounding the first and second plate vias with first and second keyhole-shaped solder masks, respectively.

19. The method of claim 14, further comprising covering the substrate partially or entirely except the first and second conductive pads and the first and second plated vias.

20. A method of reducing solder wicking on a substrate when connecting a surface mount component to conductive layers of the substrate, comprising:
   providing a surface mount component that includes a package having an upper surface with first solderable terminal sides and a first terminal end and second solderable terminal sides and a second terminal end;
   connecting a first plated via to a first conductive layer;
   surrounding the first plated via with a first solder mask;
   connecting a second plated via to a second conductive layer;
   surrounding the second plated via to a second solder mask;
   connecting a first conductive pad with a conductive trace to the first plated via, wherein the first conductive pad includes a portion that is exposed to solder and extends beyond the first solderable terminal sides of the surface mount component to increase solder formation along the first solderable terminal sides and to reduce solder formation at the first plated via;
   connecting a second conductive pad with a conductive trace connected to the second plated via, wherein the second conductive pad includes a portion that is exposed to solder and extends beyond the second solderable terminal sides of the surface mount component to increase solder formation along the second solderable terminal sides and to reduce solder formation at the second plated via;
   reducing solder formation using a first solder mask at the first terminal end of the surface mount component;
   reducing solder formation using a second solder mask at the second terminal end of the surface mount component; and
   forming the first and second conductive pads symmetrically with respect to the first plated via and the second plated vias, respectively.

* * * * *